US012604745B2

(12) United States Patent
Fu et al.

(10) Patent No.: US 12,604,745 B2
(45) Date of Patent: Apr. 14, 2026

(54) SWITCHING POWER DEVICE AND PARALLEL CONNECTION STRUCTURE THEREOF

(71) Applicant: Formitek Electric (Zhoushan) Co., Ltd., Zhoushan City (CN)

(72) Inventors: Yue Fu, Nanjing (CN); Lingtao Kong, Nanjing (CN)

(73) Assignee: FORMITEK ELECTRIC (ZHOUSHAN) CO., LTD., Zhoushan City (CN)

( * ) Notice: Subject to any disclaimer, the term of this patent is extended or adjusted under 35 U.S.C. 154(b) by 792 days.

(21) Appl. No.: 17/938,856

(22) Filed: Oct. 7, 2022

(65) Prior Publication Data

US 2023/0032828 A1 Feb. 2, 2023

Related U.S. Application Data

(63) Continuation of application No. PCT/CN2022/086201, filed on Apr. 12, 2022.

(30) Foreign Application Priority Data

Jul. 6, 2021 (CN) .......................... 202121527454.6
Aug. 9, 2021 (CN) .......................... 202121848994.4

(51) Int. Cl.
*H01L 23/495* (2006.01)
*H01L 23/00* (2006.01)

(52) U.S. Cl.
CPC .. *H01L 23/49562* (2013.01); *H01L 23/49568* (2013.01); *H01L 23/49575* (2013.01); *H01L 24/06* (2013.01); *H01L 24/48* (2013.01); *H01L* *2224/0237* (2013.01); *H01L 2224/04042* (2013.01); *H01L 2224/48247* (2013.01)

(58) Field of Classification Search
None
See application file for complete search history.

(56) References Cited

U.S. PATENT DOCUMENTS

| | | | |
|---|---|---|---|
| 9,997,500 B1 | 6/2018 | Chen et al. | |
| 2002/0076851 A1* | 6/2002 | Eden .................... | H10D 64/251 |
| | | | 257/E23.079 |
| 2006/0263988 A1 | 11/2006 | Takahashi et al. | |
| 2013/0134598 A1* | 5/2013 | Anderson ........... | H01L 23/4824 |
| | | | 438/618 |
| 2018/0211953 A1 | 7/2018 | Chen et al. | |
| 2020/0395322 A1* | 12/2020 | McPherson ........... | H01L 25/072 |
| 2021/0313243 A1* | 10/2021 | McPherson ....... | H01L 23/49541 |

FOREIGN PATENT DOCUMENTS

| | | |
|---|---|---|
| CN | 106952880 A | 7/2017 |
| CN | 113707624 A | 11/2021 |
| CN | 215183941 U | 12/2021 |
| CN | 216054669 U | 3/2022 |

* cited by examiner

*Primary Examiner* — Sue A Purvis
*Assistant Examiner* — Jordan M Klein
(74) *Attorney, Agent, or Firm* — Hodgson Russ LLP

(57) ABSTRACT

A switching power device comprises a device lead-frame. Gates, Kelvin sources and a drain are formed on the device lead-frame, the gates and the Kelvin sources are arranged at one end of the device lead-frame, and the drain is arranged at the other end of the device lead-frame; and two gates and two Kelvin sources are provided. One end of the device lead-frame is sequentially provided with the gate, the Kelvin source, the Kelvin source and the gate, so as to form a symmetrical pin structure.

16 Claims, 3 Drawing Sheets

SWITCHING POWER DEVICE AND PARALLEL CONNECTION STRUCTURE THEREOF

CROSS-REFERENCE TO RELATED APPLICATIONS

This application is a continuation of International Application No. PCT/CN2022/086201, filed Apr. 12, 2022, which claims priority to Chinese Patent Application No. 202121527454.6, filed Jul. 6, 2021, and Chinese Patent Application No. 202121848994.4, filed Aug. 9, 2021. The entire disclosures of the aforementioned applications are incorporated herein by reference.

TECHNICAL FIELD

The present disclosure relates to the technical field of power devices, and in particular, to a switching power device and a parallel connection structure of switching power devices.

BACKGROUND

For a switching power device, such as a gallium nitride power device which serves as a third-generation semiconductor material, the gallium nitride power device can achieve a higher switching frequency, a higher system efficiency and a higher power density. However, the maximum output current capability of a single gallium nitride discrete device is limited by the cost, the packaging form and heat dissipation conditions of a chip. In some high-power power electronic applications, a plurality of gallium nitride power devices need to be connected in parallel, so as to implement high-power applications and better heat dissipation conditions.

A gate of a conventional gallium nitride discrete device is a single pin. From the perspective of design of a gallium nitride device, the conventional gate design will lead to non-uniform supply of a gate driving current inside the chip, affecting the chip performance thereby limiting the application of gallium nitride in medium-power and high-power devices.

SUMMARY

There are provided a switching power device and a parallel connection structure of switching power devices according to embodiments of the present disclosure. The technical solution is as below:

According to a first aspect of embodiments of the present disclosure, there is provided a device lead-frame, on which gates, Kelvin sources and a drain are formed, wherein the gates and the Kelvin sources are arranged at one end of the device lead-frame, and the drain is arranged at the other end of the device lead-frame; and wherein two gates and two Kelvin sources are provided, and one end of the device lead-frame is sequentially provided with the gate, the Kelvin source, the Kelvin source and the gate, so as to form a symmetrical pin structure.

According to a second aspect of embodiments of the present disclosure, there is provided a parallel connection structure of switching power devices, comprising: a driving IC chip and two of the described switching power devices; wherein each the switching power device, comprising:

a device lead-frame, wherein gates, Kelvin sources and a drain are formed on the device lead-frame, the gates and the Kelvin sources are arranged at one end of the device lead-frame, and the drain is arranged at the other end of the device lead-frame; and wherein two gates and two Kelvin sources are provided, and one end of the device lead-frame is sequentially provided with the gate, the Kelvin source, the Kelvin source and the gate, so as to form a symmetrical pin structure;

wherein the two switching power devices are connected in parallel, and an output end of the driving IC chip is connected to gates and Kelvin sources of the switching power devices to form a driving circuit.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

In order to make the content of the present disclosure more easily and clearly understood, the present disclosure will be further described in detail below according to specific embodiments of the present disclosure in conjunction with the accompanying drawings, in which.

Illustration of reference signs in the description: 10—switching power device, 11—device lead-frame, 12—heat dissipation thermal pad, 20—gate, 30—Kelvin source, 40—drain, 21—die gate wire-bonding pad, 31—die source wire-bonding pad, 41—die drain wire-bonding pad.

DETAILED DESCRIPTION

Hereinafter, the present disclosure will be further described with reference to the accompanying drawings and specific embodiments, so that a person skilled in the art could better understand the present disclosure and implement same, but the embodiments listed are not intended to limit the present disclosure.

Referring to FIGS. 1 to 5, the present disclosure discloses a switching power device and a parallel connection structure thereof. The switching power device comprises a device lead-frame 11 and a power semiconductor die. The power semiconductor die is arranged on the device lead-frame 11. The switching power device may be a gallium nitride power device or a silicon power device. The power semiconductor die may be but not limited to a gallium nitride power semiconductor die or a silicon power semiconductor die.

Gates 20, Kelvin sources 30 and a drain 40 are formed on the device lead-frame 11. In the switching power device, the gates 20 and the Kelvin sources 30 are arranged at one end of the device lead-frame 11, and the drain 40 is arranged at the other end of the device lead-frame 11.

Figure 1:
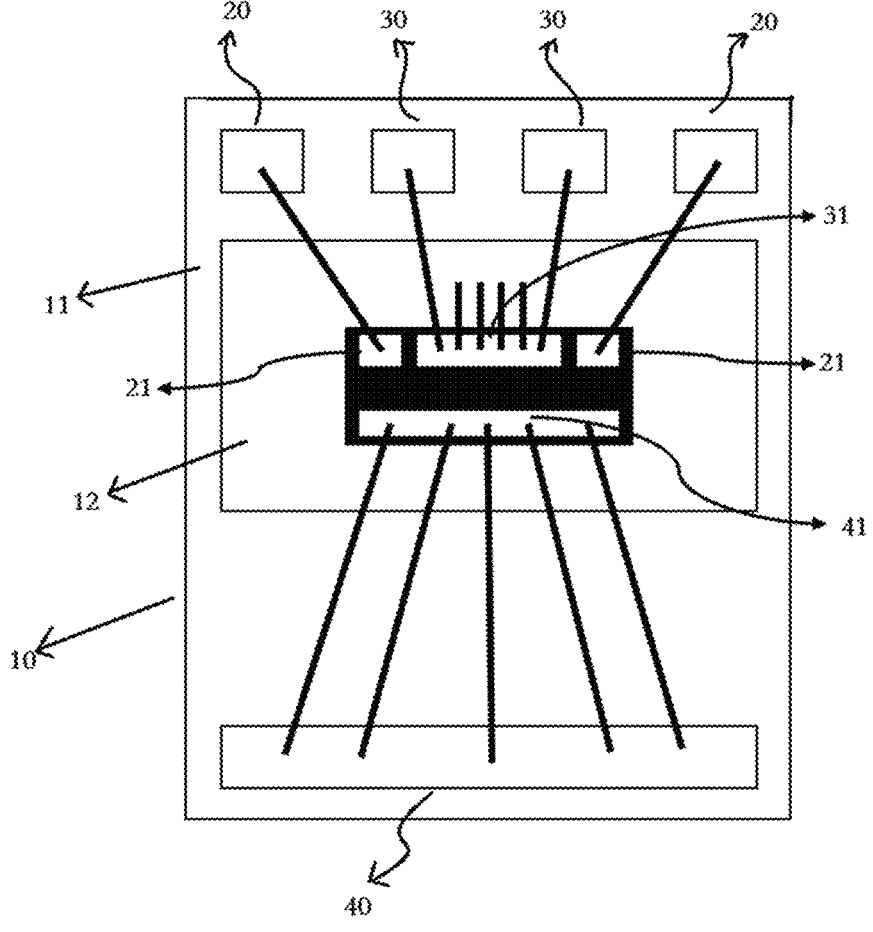
FIG. 1 is a schematic structural diagram of a device lead-frame and a power semiconductor die according to the present disclosure.
Figure 2:
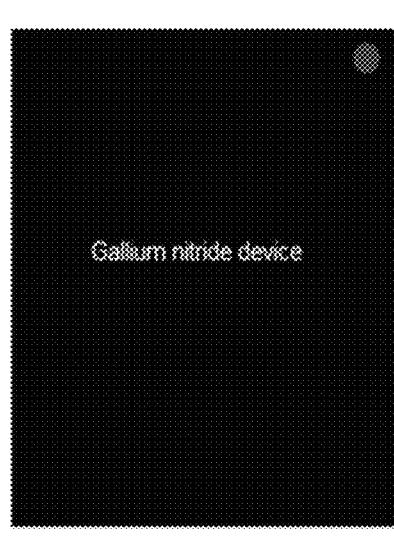
FIG. 2 is a schematic diagram of a packaging structure of a switching power device according to the present disclosure.
Figure 2:
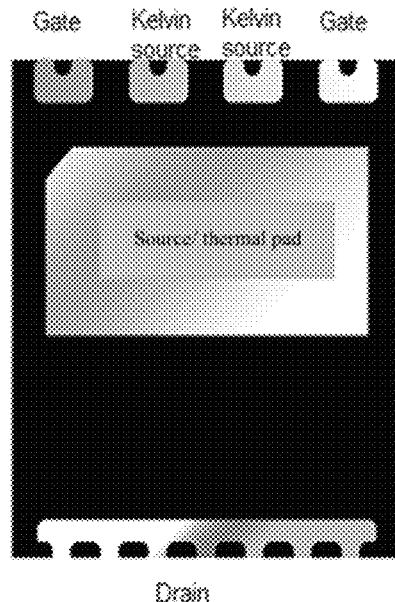
Figure 3:
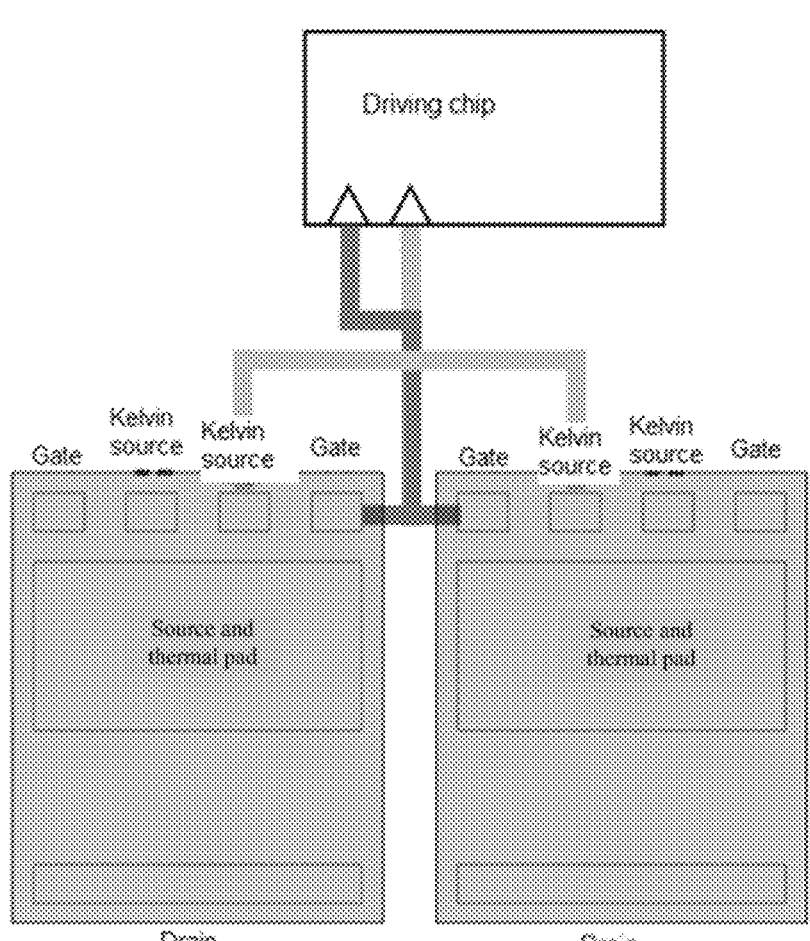
FIG. 3 is a schematic diagram of a parallel connection structure of switching power devices according to the present disclosure.

According to embodiments, with reference to FIG. 1, one end of the device lead-frame 11 is sequentially provided with the gate 20, the Kelvin source 30, the Kelvin source 30 and the gate 20, and the other end of the device lead-frame is provided with the drain 40. Pins of the switching power device 10 are designed to be symmetrical. The switching power device 10 has bilaterally symmetrical gates 20 and bilaterally symmetrical Kelvin sources, so that the internal heat generation of the switching power device 10 can be more balanced, and the switching power device 10 has better current withstand capability and has better reliability.

Figure 4:
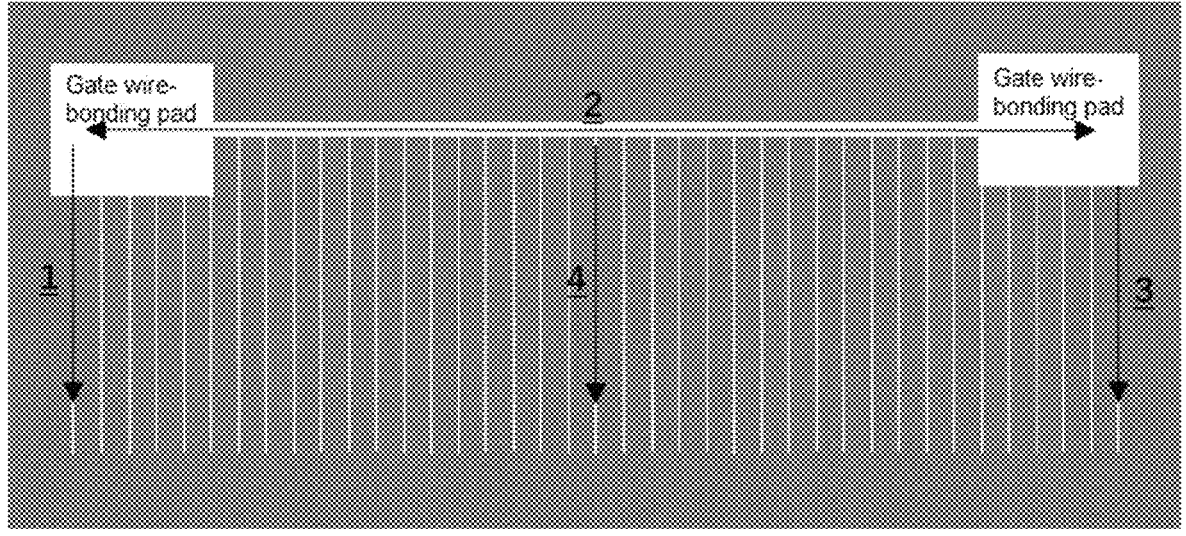
FIG. 4 is a schematic diagram of a gate circuit and finger distribution of an internal die of a switching power device in the present disclosure.

The switching power device 10 comprises a power semiconductor die arranged on a heat dissipation thermal pad 12, which is arranged on the device lead-frame. The power semiconductor die is provided with die gate wire-bonding pads 21, a die source wire-bonding pad 31 and a die drain wire-bonding pad 41. The die gate wire-bonding pads 21 and the die source wire-bonding pad 31 are arranged at one end of the power semiconductor die, and the die drain wire-bonding pad 41 is arranged at the other end of the power semiconductor die. Two die gate wire-bonding pads 21 are provided, and the die source wire-bonding pad 31 is arranged between the two die gate wire-bonding pads 21. The gates 20 and the die gate wire-bonding pads 21 are connected by metal bonded wires, the Kelvin sources 30 and the die source wire-bonding pad 31 are connected by metal bonded wires, the drain 40 and the die drain wire-bonding pad 41 are connected by metal bonded wires, and source wire-bonding of the die is directly connected to a heat dissipation thermal pad of the lead-frame. By providing the two die gate wire-bonding pads 21 and the die source wire-bonding pad 31, it ensures that the layout is symmetrical, and the bonded wires can be reduced to be the shortest. In addition, the design of the dual gates 20 also reduces non-uniformity of fingers (cells) inside the switching power device caused by long gate metal wirings inside the die. As shown in FIG. 4, a die gate wire-bonding pad on the left side and a die gate wire-bonding pad on the right side are connected to a gate driving IC chip. A current flows into the power semiconductor die via the die gate wire-bonding pads and fingers (i.e. white lines in FIG. 4). Since in the present application, two ends of the power semiconductor die are respectively provided with one die gate wire-bonding pad, the current at each of the two ends flows into the power semiconductor die through fingers closer to said end. For example, a current from the left gate wire-bonding pad passes through fingers between the finger 1 and the finger 4, and a current from the right die gate wire-bonding pad passes through fingers between the finger 4 and the finger 3. In this way, the finger 3 does not need the finger 2 to flow the current from the left die gate wire-bonding pad into the power semiconductor die, compared with the conventional technique (i.e. only one gate wire-bonding pad), but the current directly flows into the power semiconductor die from the right die gate wire-bonding pad, thereby reducing the resistance, and further reducing uneven voltages at fingers on the left side and the right side.

The area of the die gate wire-bonding pads 21 is less than that of the die source wire-bonding pad 31 and of the die drain wire-bonding pad 41, but two die gate wire-bonding pads 21 are provided, so that the die gate wire-bonding pads can be connected to a plurality of metal bonded wires, which ensures that the die gate wire-bonding pads 21 are reliably connected to the plurality of metal bonded wires and makes the switching power device 10 more reliable.

According to embodiments, a substrate of the power semiconductor die is but not limited to a silicon substrate, and the dimension of a wafer silicon substrate of the die is generally selected as, for example, six inches or eight inches. In the switching power device 10, the width of the die gate wire-bonding pads 21, the width of the die source wire-bonding pad 31 and the width of the die drain wire-bonding pad 41 are usually 50-500 μm.

The switching power device 10 comprises a packaging structure, and the packaging structure is also symmetrical. The packaging structure includes, but is not limited to, surface-mounted packaging, in-line packaging, and flip-chip packaging. The dimensions of the surface-mounted packaging include 5 mm×6 mm, 6 mm×8 mm and 8 mm×8 mm.

Before the packaging process, the package type and dimension need to be determined. Taking surface-mounted DFN packaging as an example, in order to achieve the packaging, a design of a lead-frame is first required. The lead frame may usually be shared by some specific chips of different sizes and types. The packaging process comprises: attaching a film to the front face of a wafer, grinding a back portion thereof, cutting the wafer by using a laser and a diamond tool, attaching a die on a frame, wire-bonding of the die, and plastic-moulding of the die.

A parallel connection structure of switching power devices comprises a driving IC chip and two switching power devices 10. The two switching power devices 10 are connected in parallel, gates 20 of the two switching power devices 10 are connected by a gate driving wiring, and Kelvin sources 30 of the two switching power devices 10 are connected by a source wiring. An output end of the driving IC chip is connected to the gates 20 and the Kelvin sources 30 of the switching power devices 10, to form a driving loop.

The gate driving wiring is connected to the output end of the driving IC chip to form a gate driving loop. Pins of the switching power devices 10 are highly symmetrical, and the gate driving wiring can be shared, so that the gate driving loops can be the same applied. FIG. 4 shows a gate circuit and finger distribution inside a die according to the present invention.

By the symmetrical design of gates, in terms of practical applications in electronic systems, it facilitates the layout of wires on a circuit board, which is more applicable to a situation in which a plurality of switching power devices 10 are connected in parallel. Compared to the conventional packaging, the parallel connection structure of the present disclosure has a shorter lead, which can reduce parasitic resistance and inductance caused by the packaging lead, and is beneficial to improve the overall performance of the switching power device 10.

Figure 5:
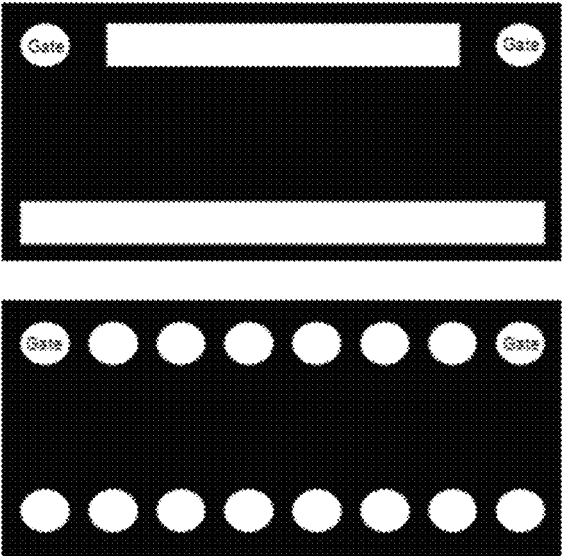
FIG. 5 is a schematic diagram of implementation of a symmetrical design of gates of an internal die of a switching power device according to the present disclosure.

Referring to FIG. 5, different methods may also be adopted to implement a symmetrical design of gates of an internal die of a switching power device. For example, the two die gate wire-bonding pads are elliptical or circular and are respectively distributed at two ends of the strip-shaped source wire-bonding pad. For another example, the two die gate wire-bonding pads are distributed respectively at two ends of a plurality of die source wire-bonding pads which are distributed at intervals in an elliptical shape or a circular shape.

A manufacturing process for the power semiconductor die generally comprises ten or more mask processes. These processes define the channel of the device, the voltage withstand properties of the device, the dimension of the device, the peripheral protection ring of the device, etc. The manufacturing process of the power semiconductor die further comprises a subsequent metal interconnection process, including defining widths of the die gate wire-bonding pads 21, the die source wire-bonding pad 31 and the die drain wire-bonding pad 41 of the device, interconnecting metal wires, and connecting to the outside. Generally, a protection and insulation layer is formed by a dielectric such as an oxide or a nitride between metal and metal.

In some embodiments, the two die gate wire-bonding pads 21 of the power semiconductor die may be connected through a metal interconnection layer to reduce the impedance.

Apparently, the described embodiments are merely examples made for clear illustration, and are not intended to limit the embodiments. For a person of ordinary skill in the art, other variations or modifications of different forms may be made on the basis of the described illustration. Herein, it is neither necessary nor possible to list all embodiments in an exhaustive manner. Moreover, obvious variations or modifications derived therefrom are still within the scope of protection of the present disclosure and creation.

What is claimed is:

1. A switching power device, comprising:
a device lead-frame, on which gates, Kelvin sources and a drain are formed;
wherein the gates and the Kelvin sources are arranged at one end of the device lead-frame, and the drain is arranged at another end of the device lead-frame;
wherein two gates and two Kelvin sources are provided, and one end of the device lead-frame is sequentially provided with the gate, the Kelvin source, the Kelvin source and the gate, so as to form a symmetrical pin structure;
wherein the switching power device comprises a power semiconductor die arranged on the device lead-frame, wherein the power semiconductor die is provided with die gate wire-bonding pads, a die source wire-bonding pad and a die drain wire-bonding pad, and wherein the gates are connected to the die gate wire-bonding pads, the Kelvin sources are connected to the die source wire-bonding pad, and the drain is connected to the die drain wire-bonding pad; and
wherein two die gate wire-bonding pads are provided, and each die gate wire-bonding pad is connected to one gate.

2. The switching power device according to claim 1, wherein each of the die gate wire-bonding pads has an area less than that of the die source wire-bonding pad and of the die drain wire-bonding pad.

3. The switching power device according to claim 1, wherein the device lead-frame is provided with a heat dissipation thermal pad, and the power semiconductor die is arranged on the heat dissipation thermal pad.

4. The switching power device according to claim 1, wherein a width of the die gate wire-bonding pads, a width of the die source wire-bonding pad and a width of the die drain wire-bonding pad are all 50-500 μm.

5. The switching power device according to claim 1, wherein the two die gate wire-bonding pads of the power semiconductor die are connected by a metal interconnection layer.

6. The switching power device according to claim 1, wherein the switching power device is a gallium nitride power device or a silicon power device, and the power semiconductor die is a gallium nitride power semiconductor die or a silicon power semiconductor die.

7. The switching power device according to claim 1, wherein the switching power device comprises a packaging structure, wherein the packaging structure is a surface-mounted packaging structure, an in-line packaging structure, or a flip-chip packaging structure.

8. The switching power device according to claim 7, wherein the packaging structure has a dimension of 5 mm×6 mm, 6 mm×8 mm or 8 mm×8 mm.

9. A parallel connection structure of switching power devices, comprising:
a driving IC chip and two of switching power devices;
wherein each switching power device of the switching power devices, comprise a device lead-frame;
wherein gates, Kelvin sources and a drain are formed on the device lead-frame, the gates and the Kelvin sources are arranged at one end of the device lead-frame, and the drain is arranged at another end of the device lead-frame;
wherein two gates and two Kelvin sources are provided, and one end of the device lead-frame is sequentially provided with the gate, the Kelvin source, the Kelvin source and the gate, so as to form a symmetrical pin structure;
wherein the two switching power devices are connected in parallel, and an output end of the driving IC chip is connected to gates and Kelvin sources of the switching power devices to form a driving circuit;
wherein the switching power device comprises a power semiconductor die arranged on the device lead-frame, wherein the power semiconductor die is provided with die gate wire-bonding pads, a die source wire-bonding pad and a die drain wire-bonding pad, and wherein the gates are connected to the die gate wire-bonding pads, the Kelvin sources are connected to the die source wire-bonding pad, and the drain is connected to the die drain wire-bonding pad; and
wherein two die gate wire-bonding pads are provided, and each die gate wire-bonding pad is connected to one gate.

10. The parallel connection structure of switching power devices according to claim 9, wherein gates of the two switching power devices are connected by a gate driving wire, and the gate driving wire is connected to the output end of the driving IC chip, to form a gate driving circuit.

11. The parallel connection structure of switching power devices according to claim 9, wherein each of the die gate wire-bonding pads has an area less than that of the die source wire-bonding pad and of the die drain wire-bonding pad.

12. The parallel connection structure of switching power devices according to claim 9, wherein the device lead-frame is provided with a heat dissipation thermal pad, and the power semiconductor die is arranged on the heat dissipation thermal pad.

13. The parallel connection structure of switching power devices according to claim 9, wherein a width of the die gate wire-bonding pads, a width of the die source wire-bonding pad and a width of the die drain wire-bonding pad are all 50-500 μm.

14. The parallel connection structure of switching power devices according to claim 9, wherein the two die gate wire-bonding pads of the power semiconductor die are connected by a metal interconnection layer.

15. The parallel connection structure of switching power devices according to claim 9, wherein the switching power device is a gallium nitride power device or a silicon power device, and the power semiconductor die is a gallium nitride power semiconductor die or a silicon power semiconductor die.

16. The parallel connection structure of switching power devices according to claim 15, wherein the switching power device comprises a packaging structure, wherein the packaging structure is a surface-mounted packaging structure, an in-line packaging structure, or a flip-chip packaging structure.

* * * * *